United States Patent
Hirler et al.

(10) Patent No.: US 8,247,874 B2
(45) Date of Patent: Aug. 21, 2012

(54) DEPLETION MOS TRANSISTOR AND CHARGING ARRANGEMENT

(75) Inventors: Franz Hirler, Isen (DE); Anton Mauder, Kolbermoor (DE); Joachim Weyers, Hoehenkirchen (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 96 days.

(21) Appl. No.: 12/868,918

(22) Filed: Aug. 26, 2010

(65) Prior Publication Data

US 2012/0049273 A1  Mar. 1, 2012

(51) Int. Cl.
*H01L 27/088* (2006.01)

(52) U.S. Cl. ........ 257/392; 257/330; 257/329; 257/341; 257/348; 257/504; 257/545; 257/E27.061

(58) Field of Classification Search ............... 257/330, 257/329, 327, 341, 348, 392, 504, 545, E27.061
See application file for complete search history.

(56) References Cited

U.S. PATENT DOCUMENTS

| 5,285,369 A | 2/1994 | Balakrishnan |
| 7,709,891 B2 | 5/2010 | Mauder et al. |
| 2004/0043565 A1* | 3/2004 | Yamaguchi et al. ......... 438/268 |
| 2005/0161732 A1* | 7/2005 | Mizukami et al. ............ 257/327 |
| 2008/0265320 A1* | 10/2008 | Mauder et al. ............... 257/341 |

FOREIGN PATENT DOCUMENTS

DE   10 2007 004 091 A1   8/2008

OTHER PUBLICATIONS

Mirchandani, A., A Novel N-Channel MOSFET Featuring an Integrated Schottky and No Internal P-N Junction, Proceedings of 2004 International Symposium on Power Semiconductor Devices & ICs, Kitakyushu; pp. 405-408.

* cited by examiner

*Primary Examiner* — Marcos D. Pizarro
*Assistant Examiner* — Eva Yan Montalvo
(74) *Attorney, Agent, or Firm* — Murphy, Bilak & Homiller, PLLC

(57) ABSTRACT

A depletion transistor includes a source region and a drain region of a first conductivity type, a channel region of the first conductivity type arranged between the source region and the drain region and a first gate electrode arranged adjacent the channel region and dielectrically insulated from the channel region by a gate dielectric. The depletion transistor further includes a first discharge region of a second conductivity type arranged adjacent the gate dielectric and electrically coupled to a terminal for a reference potential. The depletion transistor can be included in a charging circuit.

24 Claims, 7 Drawing Sheets

DEPLETION MOS TRANSISTOR AND CHARGING ARRANGEMENT

FIELD OF THE INVENTION

The present invention relates to a depletion transistor and to a charging arrangement with a depletion transistor.

BACKGROUND

In some electronic circuit applications there is a need to charge an electric charge storage element, like a capacitor, until a voltage across the charge storage element reaches a given threshold voltage. A charging circuit for charging the charge storage element can include a depletion MOS transistor which has its drain-source path connected in series with the charge storage element and which has its gate terminal connected to a terminal for a reference potential, wherein the series circuit with the depletion MOS transistor and the charge storage element is connected between supply voltage terminals. When in such an arrangement the charge storage element is uncharged, i.e. when the voltage across the charge storage element is zero, and when a supply voltage is applied between the supply terminals, a charging process starts which results in an increase of the voltage across the charge storage element. When the voltage across the charge storage element increases, the gate-source voltage of the depletion MOS transistor changes, wherein the depletion MOS transistor switches off (pinches off) when the gate-source voltage reaches its pinch-off voltage. In such applications the reference potential of the gate electrode and the pinch-off voltage of the transistor are selected or adjusted such that the transistor pinches off when a desired voltage across the charge storage element is reached.

A depletion MOS transistor includes a channel region and a gate electrode which are dielectrically insulated from one another by a gate dielectric. The channel region is n-doped in an n-type transistor and is p-doped in a p-type transistor. In an n-type transistor the majority charge carriers are electrons and the minority charge carriers are holes, while in a p-type transistor the majority charge carriers are holes and the minority charge carriers are electrons. In both of these types of depletion transistors, minority charge carriers can accumulate in the channel region. These minority charge carriers are, for example, generated by thermal charge carrier generation. Minority charge carriers accumulated in the channel region can influence the pinch-off voltage of a depletion transistor. In a worst scenario the minority charge carriers may prevent the depletion transistor from switching off at all.

There is, therefore, a need for a depletion transistor which reliably switches on and off dependent on its set pinch-off voltage.

SUMMARY

A first aspect relates to a depletion transistor including a source region and a drain region of a first conductivity type, a channel region of the first conductivity type arranged between the source region and the drain region, and a first gate electrode arranged adjacent the channel region and dielectrically insulated from the channel region by a gate dielectric. The depletion transistor further includes a first discharge region of a second conductivity type arranged distant to the source region and adjacent the gate electrode and electrically coupled to a terminal for a reference potential.

A second aspect relates to an integrated circuit including an enhancement transistor with a drift region and drift control region arranged adjacent the drift region and electrically insulated from the drift region by a drift control zone dielectric. The integrated circuit further includes a capacitive charge storage element coupled to the drift control region, and a charging circuit coupled to the charge storage element. The charging circuit includes a depletion transistor with a source region and a drain region of a first conductivity type, a channel region of the first conductivity type arranged between the source region and the drain region, a first gate electrode arranged adjacent the channel region and dielectrically insulated from the channel region by a gate dielectric, and a first discharge region of a second conductivity type arranged distant to the source region and adjacent the gate electrode and electrically coupled to a terminal for a reference potential.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figures 1, 2:
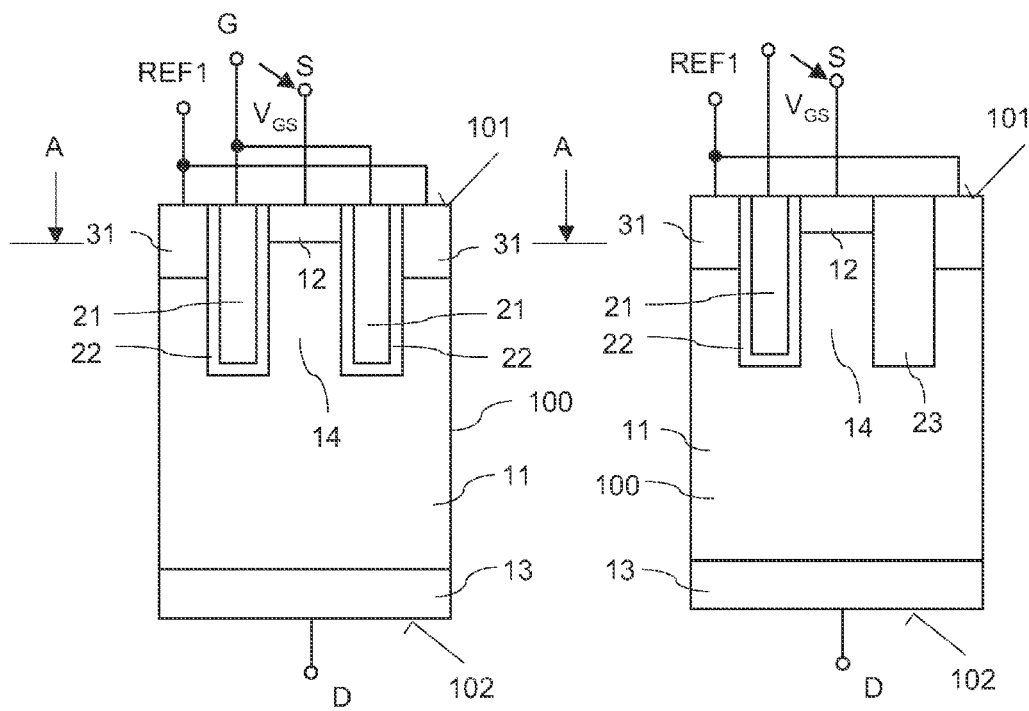
FIG. 1 schematically illustrates a vertical cross section through a depletion transistor according to a first embodiment.
FIG. 2 schematically illustrates a vertical cross section through a depletion transistor according to a second embodiment.

FIGS. 1 and 2 schematically illustrate vertical cross sections through a depletion transistor according to a first embodiment and a second embodiment. The transistors include a semiconductor body 100 with a first surface 101 and a second surface 102. FIGS. 1 and 2 illustrate cross sections in a vertical section plane which extends perpendicular to the first and second surfaces 101, 102.

The depletion transistors include a drift region 11 of a first conductivity type which is arranged between a source region 12 and a drain region 13 of the first conductivity type. The source region 12 is connected to a source terminal S (schematically illustrated in FIGS. 1, 2), and the drain region 13 is connected to a drain terminal D (schematically illustrated in FIGS. 1, 2). A gate electrode 21 is arranged adjacent a section 14 of the drift region 11 and at least partially overlaps the source region 12. The section 14 of the drift region 11 which is arranged adjacent the gate electrode 21 will be referred to as channel region in the following. The gate electrode 21 is dielectrically insulated from the semiconductor body 100 by a gate dielectric 22, and is electrically connected to a gate terminal G (schematically illustrated in FIG. 1).

The depletion transistors illustrated in FIGS. 1 and 2 are trench transistors. In these components the gate electrode 21 is arranged in a trench which from the first surface 101 extends into the semiconductor body 100. However, this is only an example. The basic principle which will be explained in the following can also be applied to other types of transistors, such as transistor with a planar gate electrode, as well.

In the embodiment of FIG. 1 the channel region 14 is arranged between two sections of the gate electrode 21 which are arranged distant from one another in a horizontal direction of the semiconductor body 100; the horizontal direction runs parallel to the first and second surface 101, 102. The source region 12 adjoins the channel region 14 in the vertical direction of the semiconductor body 100 and is also arranged between the two gate electrode 21 sections between which the channel region 14 is arranged.

To implement the channel region 14 and the source region 12 such that they are arranged between two gate electrode 21 sections arranged distant from one another in the horizontal direction is only an example. Referring to FIG. 2, the channel region 14 and the source region 12 can also be arranged between the gate electrode 21 and a dielectric or insulation layer 23, wherein the gate electrode and the dielectric layer 23 are arranged distant from one another in the horizontal direction, and wherein the dielectric layer 23—like the gate electrode 21 and the gate dielectric 22—from the first surface 101 extends in a vertical direction into the semiconductor body 100.

Referring to FIGS. 1 and 2, the depletion transistor further includes a discharge region 31 of a second conductivity type which is complementary to the first conductivity type. The first discharge region 31 is electrically coupled to a terminal REF1 for a reference potential. In the embodiment illustrated in FIGS. 1 and 2, the first discharge region 31 is arranged distant to the source region 12 and is arranged adjacent the gate electrode 21 or, more precisely, the gate dielectric 22. In the embodiment illustrated in FIGS. 1 and 2 the discharge region 31 is arranged directly below the first surface 101 and is separated from the source 12 and channel 14 regions through the gate electrode 21 and the gate dielectric 22 or dielectric layer 23, respectively.

The operating principle of the depletion transistors illustrated in FIGS. 1 and 2 will now be explained. For explanation purposes it is assumed that the transistor is an n-type transistor in which the drift, source and drain regions 11, 12, 13 are n-doped semiconductor regions, while the discharge region 31 is a p-doped region. However, the principle explained herein is also applicable to p-type transistors in which the drift, source and drain regions are p-doped regions and the discharge region 31 is an n-doped region.

The component is in its on-state when a positive voltage is applied between the drain and source terminals D, S and when there is a conducting channel in the channel region 14 between the source region 12 and the drift region 11. The conducting channel in the channel region 14 is controlled by the gate electrode 21 or, more precisely, the electrical potential of the gate electrode 21. When—in an n-type transistor—the electrical potential of the gate electrode 21 is negative relative to the electrical potential of the source region 12 and the channel region 14, the channel region is depleted from charge carriers along the gate dielectric 22 in the channel region 14. This depletion region expands with an increasing difference between the electrical potentials of the gate electrode 21 and the channel region 14, wherein a conducting channel in the channel region 14 is pinched-off when the depletion region reaches from one gate electrode section to the other gate electrode section in the component of FIG. 1, or reaches from the gate electrode to the insulation layer 23 in the component of FIG. 2.

In the embodiment illustrated in FIG. 2, the insulation layer 23 in the vertical direction of the semiconductor body 100 has the same dimension as the gate electrode structure with the gate electrode 21 and the gate dielectric. However, this is only an example. The gate electrode structure could also extend deeper into the semiconductor body 100 than the insulation layer 23, or the insulation layer 23 could extend deeper into the semiconductor body 100 than the gate electrode structure, and could even extend down to the second surface 102.

The component is in its off-state when the conducting channel in the channel region 14 is pinched off. The value of the gate-source voltage $V_{GS}$, which is the voltage between the gate and the source terminals G, S, at which the channel is pinched off is referred to as pinch-off voltage of the transistor. In an n-type transistor this voltage is a negative voltage. The absolute value of this voltage is, for example, dependent on the doping concentration of the channel region 14 and the distance between the two neighbouring gate electrode sections or the distance between the gate electrodes and the insulation layer 23.

The doping concentration of the channel region is, for example in the range of between $8 \cdot 10^{13}$ cm$^{-3}$ and $10^{17}$ cm$^{-3}$, or even $10^{18}$ cm$^{-3}$. The doping concentration of the drain region 13 is, for example, in the range of between $10^{19}$ cm$^{-3}$ and $10^{20}$ cm$^{-3}$, the doping concentration of the discharge region is, for example, in the range of between $10^{16}$ cm$^{-3}$ and $10^{20}$ cm$^{-3}$.

The channel region 14 can be a part of the drift region 11 and, in this case, has the same doping concentration as the drift region. However, the doping concentration of the channel region 14 may also be different from the doping concentration of the drift region 11. The doping concentration of the channel region 14 is one parameter for adjusting the pinch-off voltage, and can be higher or lower than the doping concentration of the drift region 11.

The doping concentration of the channel region 14 can be adjusted in different ways: According to one embodiment, the doping concentration of the channel region 14 is adjusted in an epitaxial process. In this process, first at least one epitaxial layer is formed on a semiconductor substrate, wherein the substrate forms the drain region 13, and the at least one first epitaxial layer forms the drift region. The doping concentration of the at least one first epitaxial layer can be adjusted during the epitaxial deposition process. Further, at least one second epitaxial layer is formed on the at least one first layer, wherein parts of the at least one first layer 14 form the channel region 14. The doping concentration of the at least one second epitaxial layer can be adjusted during the epitaxial deposition process. The source and discharge region 12, 31 are then formed in the at least one second epitaxial layer, and gate electrode 21 and the optional insulation layer 23 are formed in the at least one second epitaxial layer. The gate electrode 21 can be formed to extend down to the drift region 11, or can be formed to be completely arranged in the channel region 14, which has a different doping than the drift region 11.

According to another embodiment a channel region 14 with a doping concentration other than the doping concentration of the drift region 11 can be formed by: providing a uniformly doped epitaxial layer which has a doping concentration that corresponds to the doping concentration of the drift region 11; and implanting and/or diffusing dopant atoms into those regions in which the channel region is to be formed.

Another parameter for adjusting the pinch-off voltage of the transistor is the material type of the gate electrode 21 material. The gate electrode may, for example, include p-doped or n-doped polycrystalline semiconductor material, such as polysilicon.

The width of the channel region 14, i.e. the lateral distance between two neighbouring gate electrode sections 21 (see FIG. 1), or between the gate electrode 21 and the insulation layer 23 (see FIG. 2) is, for example, dependent on the doping concentration of the channel region 14 and/or the drift region 11. In general, the width of the channel region 14 is the smaller, the higher the doping concentration is. The width of the channel region 14 is, for example, in the range of between 5 m to 10 m, but could also be lower than 1 m at high doping concentrations (of, for example about $10^{16}$ cm$^{-3}$), or even lower than 0.1 m at higher doping concentrations (at, for example, between about $10^{17}$ cm$^{-3}$ and $10^{18}$ cm$^{-3}$.]

It is commonly known that a depletion transistor is a unipolar transistor, wherein the majority charge carriers in an n-type transistor are electrons and in a p-type transistor are holes. When the component is in operation and, in particular, when the component is in its off-state minority charge carriers can be created by, for example, thermal charge carrier generation. In an n-type transistor these minority charge carriers are holes. These minority charge carriers can accumulate in the channel region 14 along the gate dielectric 22 and can significantly influence the pinch-off voltage of the transistor. In a worst-case scenario minority charge carriers accumulated along the gate dielectric can prevent the transistor from being switched off in a conventional depletion transistor.

In the depletion transistors according to FIGS. 1 and 2 the discharge region 31 helps to avoid or at least reduce the accumulation of minority charge carriers along the gate dielectric 22. When the transistor is in operation a reference potential $V_{REF1}$ is applied to the reference terminal REF1, wherein this reference potential $V_{REF1}$ equals the gate potential or, in an n-type transistor, can be more negative than the gate potential (or, in a p-type transistor can be more positive than the gate potential).

The discharge region 31 allows p-type charge carriers, i.e. holes, to flow to the reference terminal REF1, so that an accumulation of p-type charge carriers along the gate dielectric 22 in the channel region 14 is prevented. However, the discharge region 31 is not directly connected to the channel region 14 but is connected to the channel region 14 via sections of the drift region 11. By virtue of this, there is an electrical resistance between the discharge region 31 and the channel region 14 so that in operation of the component the channel region 14 can assume a higher potential than the reference potential $V_{REF1}$.

Figure 3:
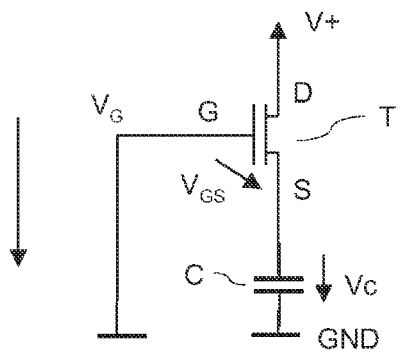
FIG. 3 illustrates a circuit diagram of a charging circuit with a depletion transistor and a capacitive charge storage element.

FIG. 3 schematically illustrates the use of a depletion transistor according to FIGS. 1 and 2 in a charging circuit which is configured to charge a capacitive charge storage element C, like, e.g., a capacitor. In the circuit diagram of FIG. 3 reference symbol T denotes the depletion transistor which is represented by its circuit symbol in FIG. 3. For explanation purposes it is assumed that the reference terminal REF1 is connected with the gate terminal G.

In the charging circuit of FIG. 3 the drain-source-path of the transistor T is connected in series with the charge storage element C, wherein the series circuit is connected between terminals for a positive supply potential V+ and a negative supply potential GND, such as, e.g., ground. For explanation purposes it is assumed that the transistor T is an n-type transistor. This transistor is connected between the terminals of the positive supply potential V+ and the charge storage element C.

Figure 4:
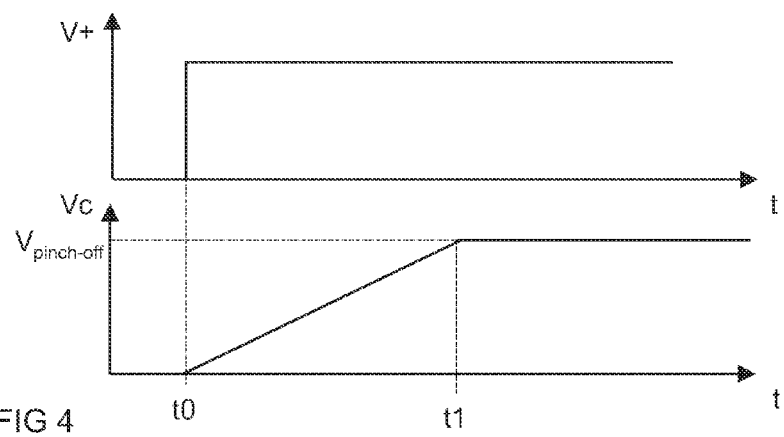
FIG. 4 shows timing diagrams illustrating the operating principle of the charging circuit of FIG. 3.

The operating principle of the charging circuit illustrated in FIG. 3 is schematically illustrated in FIG. 4. FIG. 4 shows timing diagrams of a voltage Vc across the capacitive charge storage element and the positive supply voltage V+. t0 in FIG. 4 is a time when the supply voltage V+ is switched on. For explanation purposes it is assumed that the gate terminal G of the depletion transistor D is connected with the negative supply potential GND. At time t0 the charge storage element C is completely discharged, so that the gate-source voltage $V_{GS}$ of the transistor T is zero; transistor T, therefore, is switched-on. Starting with time t0 the charge storage element C is charged, resulting in an increase of the voltage Vc across the charge storage element C. In order to simplify the illustration a linear increase of the voltage Vc is shown in FIG. 4. However, the voltage Vc usually approaches its limiting value with an exponential curve.

The absolute value of the voltage Vc across the charge storage element C corresponds to the gate-source voltage $V_{GS}$, wherein the gate-source-voltage becomes more negative with increasing voltage Vc across the charge storage element C. The charging process of the charge storage element C stops when the transistor T is switched off, i.e. when the conducting channel in the channel region 14 (see FIGS. 1 and 2) is pinched off. This is illustrated at time t1 in FIG. 4 at which the absolute value of the voltage Vc across the charge storage element C corresponds to the absolute value of the pinch-off voltage of the transistor T. The transistor T therefore limits the charging process of the charge storage element C or limits the voltage across the charge storage element C. In the embodiment illustrated in FIGS. 3 and 4 the voltage to which the charge storage element C is charged, corresponds to the pinch-off voltage of the transistor. This, however, is only an example. By suitably selecting the electrical potential at the gate terminal G other voltage limits can be adjusted as well. According to a further embodiment (not illustrated) a voltage divider is connected in parallel with the charge storage element C, and the gate terminal G is connected with a tap of the voltage divider. In this case the charge storage element C can be charged to a higher value than the pinch-off voltage of the transistor T.

In the depletion transistors of FIGS. 1 and 2 the discharge region 31 is connected to the channel region 14 via those sections of the drift region 11 that are arranged below the gate electrode and that are arranged between the discharge region 31 and a lower end of the gate electrode, wherein the lower end of the gate electrode is the end which is distant to the first surface 101 of the semiconductor body.

Figure 5:
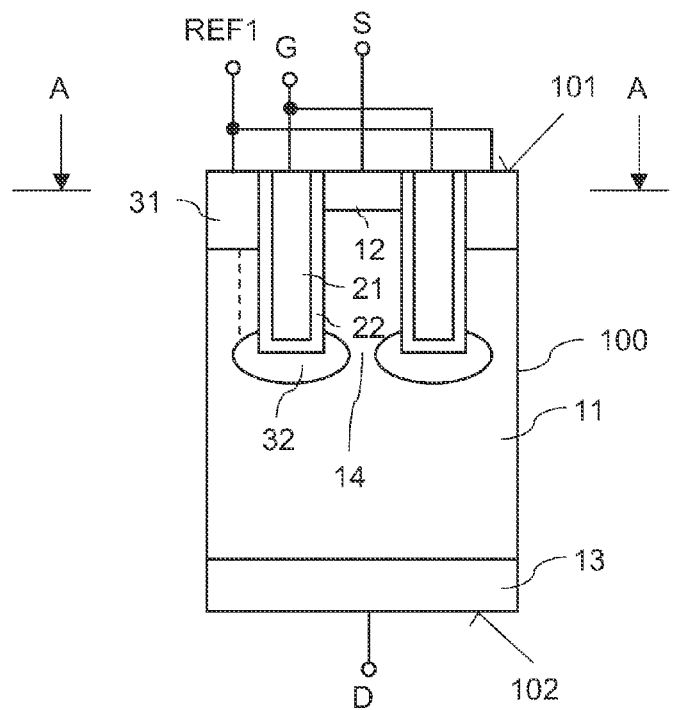
FIG. 5 schematically illustrates a vertical cross section through a depletion transistor according to a third embodiment.

FIG. 5 illustrates a vertical cross section of a depletion transistor according to a further embodiment. In this transistor, which is based on the embodiment illustrated in FIG. 1, a flow of minority charge carriers from the channel region 14 to the discharge region 31 is improved by at least one doping region 32 of the second conductivity type which is arranged below the gate electrode 21 sections. This semiconductor region 32 of the second conductivity type improves the flow of minority charge carrier in the region below the gate electrode and, thus, helps to increase the efficiency of the discharge region 31.

According to one embodiment (illustrated in dashed lines) the doping region 32 of the second conductivity type adjoins the discharge region 31. For this, the discharge region can extend down to the region 32, the region 32 below the discharge region can extend up top the discharge region 31, or a connection region of the second doping type can be arranged between the discharge region 31 and the region 32. The second doping region 32 could also be implemented in a depletion transistor according to FIG. 2. In this case, a second doping region 32 can be provided below the gate electrode 21 and/or below the insulation layer 23.

The gate electrode 21 can be implemented to have one of a plurality of different geometries. Further, the source region 12 and the discharge region 31 which are arranged distant to one another can be arranged in many different ways, i.e. the arrangement of these regions relative to one another is not restricted to the arrangement illustrated in FIGS. 1 and 2. Some embodiments which serve to illustrate only some of the plurality of many different gate electrode geometries as well as source region 12 and discharge region 31 implementations will be explained with reference to FIGS. 6 to 11. These figures illustrate horizontal cross sections in a horizontal section plane A-A which cuts through the transistor in the region of the gate electrode 21, the source region 12 and the discharge region 31. The position of this section plane is illustrated in FIG. 1.

Figure 6:
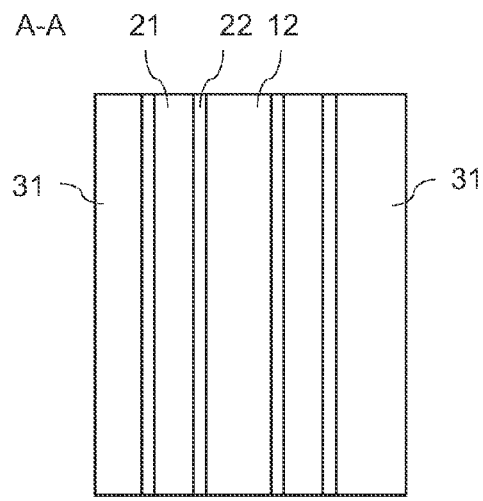
FIG. 6 schematically illustrates a horizontal cross section through a depletion transistor with a stripe-shaped gate electrode according to a first embodiment.

FIG. 6 illustrates one embodiment of a depletion transistor in which the gate electrode 21 includes two stripe-shaped gate electrode sections which are arranged distant to each other and which substantially extend parallel to each other. The source region 12 and the channel region 14 (not shown in FIG. 6) which is arranged below the source region 12 are arranged between the two gate electrode sections. The discharge region 31 includes two sections, wherein each of these sections extends along one of the gate electrode sections. The sections of the discharge region 31 are separated from the source region 12 by the gate electrode sections 21 and the gate dielectric 22.

Figure 7:
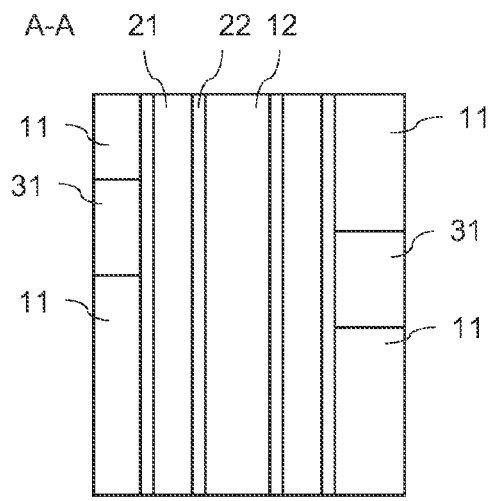
FIG. 7 schematically illustrates a horizontal cross section through a depletion transistor with a stripe-shaped gate electrode according to a second embodiment.

FIG. 7 illustrates one embodiment which is a modification of the embodiment of FIG. 6. In the embodiment of FIG. 7 the sections of the discharge region 31 are smaller than in FIG. 6 and do not extend along the complete length of the gate electrode 21 section. These sections 31 of the discharge region can be arranged offset to each other in the longitudinal direction of the gate electrode 21 (as illustrated in FIG. 7), but could also be arranged at the same position of the gate electrode sections 21 in the longitudinal direction (not shown).

Figure 8:
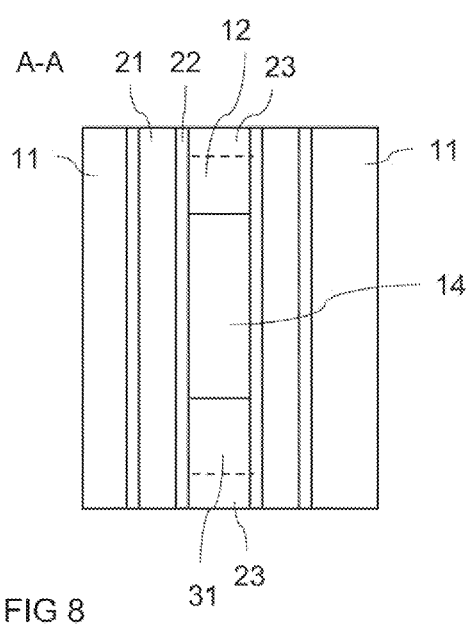
FIG. 8 schematically illustrates a horizontal cross section through a depletion transistor with a stripe-shaped gate electrode according to a third embodiment.

FIG. 8 illustrates a further modification of the depletion transistor of FIG. 6. In the transistor of FIG. 8 the source region 12 and the discharge region 31 are both arranged between the two gate electrodes 21 sections, wherein the source region 12 and the discharge region 31 are arranged distant to each other in a longitudinal direction of the stripe-shaped gate electrode 21 sections, and wherein a section of the channel region 14 is arranged between the source region 12 and the discharge region 31.

FIGS. 6 to 8 show horizontal cross sections of embodiments of depletion transistors which have vertical structures according to one of FIGS. 1 and 5, i.e. structures with two neighbouring gate electrode sections 21 adjacent the channel region 14. However, the implementations illustrated in FIGS. 6 to 8 can also be applied to a depletion transistor according to FIG. 2, which includes a gate electrode section 21 and an insulation layer 23 adjacent the channel region 23. In this case, one of the gate electrode sections 21 (and the corresponding gate dielectric 22) is to be replaced by the insulation layer 23.

Figure 9:
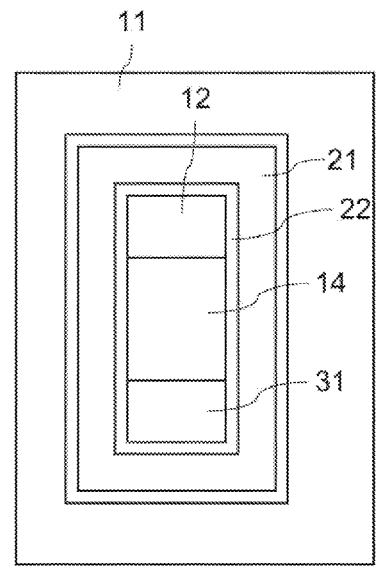
FIG. 9 illustrates a horizontal cross section through a depletion transistor with a ring-shaped gate electrode.

FIG. 9 illustrates a depletion transistor with a ring-shaped gate electrode 21. In this embodiment the source region 12 and the discharge region 31 are both arranged inside a ring defined by the ring-shaped gate electrode 21 and are arranged distant to each other. A section of the channel region 14 is arranged between the source region 12 and the discharge region 31 and separates these semiconductor regions 12, 31 from each other. In the embodiment of FIG. 9, the gate electrode 21 has the geometry of a rectangular ring. However, any other ring-geometry, like the geometry of a circular ring can be applied as well.

In the embodiment illustrated in FIG. 9, the source region 14 and the discharge region 31, in the horizontal plane, are arranged in a semiconductor region which is completely surrounded by the ring-shaped gate electrode 21 and its gate dielectric. Thus, the semiconductor region within the gate electrode is separated in a horizontal direction from other semiconductor regions by a dielectric layer (the gate dielectric 22). In the embodiment of FIG. 8, a ring-shaped dielectric structure which surrounds the semiconductor region with the source region 14 and the discharge region 31 can be formed by additionally providing two dielectric layers 23 (illustrated in dashed lines) which extend between the two gate electrode structures 21, 22.

Figure 10:
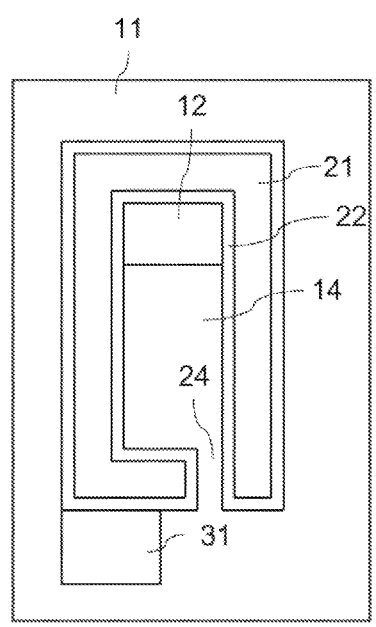
FIG. 10 illustrates a horizontal cross section through a depletion transistor with a ring-shaped gate electrode according to a further embodiment.

FIG. 10 shows a depletion transistor in which the gate electrode is ring-shaped and has a gap 24. The source region 12 is arranged within the ring defined by the ring-shaped gate electrode 21, and the discharge region 31 is arranged outside the ring but along that side of the ring-shaped gate electrode 21 at which the gate electrode has its gap 24. The source region 12 is separated from the discharge region 31 by sections of the channel region 14, wherein in the embodiment illustrated in FIG. 10 the source region 12 is arranged at that end of the semiconductor region within the gate electrode that is opposite to the gap 24.

Figure 11:
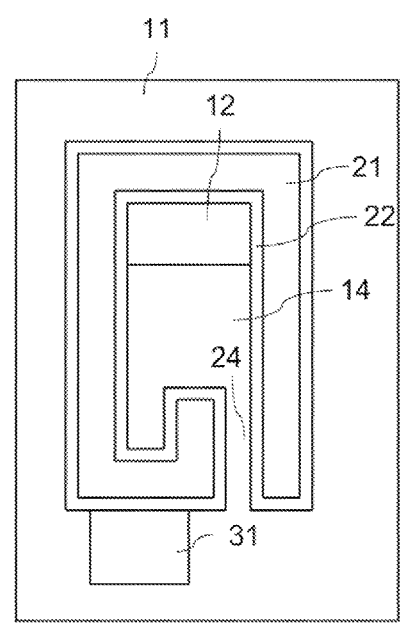
FIG. 11 illustrates a horizontal cross section through a depletion transistor with a spiral-shaped gate electrode.

FIG. 11 illustrates a further embodiment which is different from the embodiment in FIG. 10 in that the gate electrode 21 has a spiral-shaped geometry with a gap 24. The source region 12 is arranged within the ring defined by the ring-shaped gate electrode 21, and the discharge region 31 is arranged outside the ring but along that side of the ring-shaped gate electrode 21 at which the gate electrode has its gap 24. The source region 12 is separated from the discharge region 31 by sections of the channel region 14, wherein in the embodiment illustrated in FIG. 11 the source region 12 is arranged at that end of the semiconductor region within the gate electrode that is opposite to the gap 24.

Figure 12:
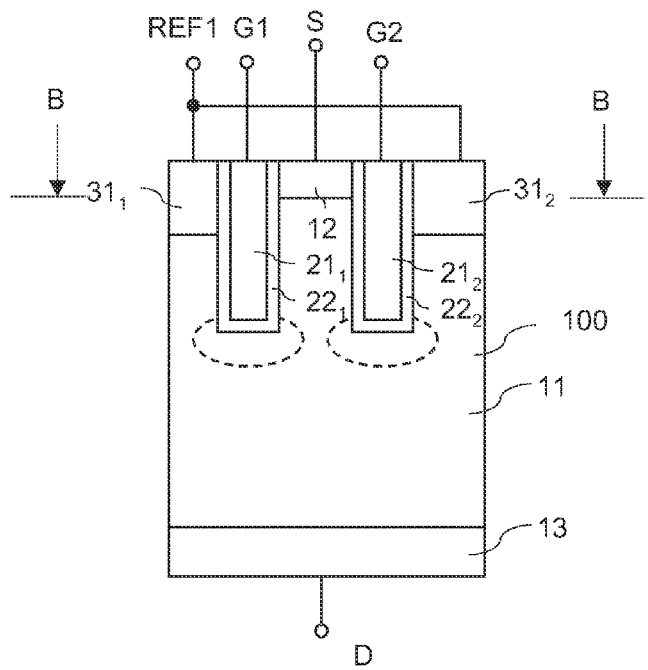
FIG. 12 illustrates a vertical cross section through a depletion transistor with two gate electrodes.

FIG. 12 illustrates a vertical cross section through a depletion transistor according to a further embodiment. This transistor includes two gate electrodes $21_1$, $21_2$ which are arranged distant from each other in a horizontal direction of the semiconductor body 100 and which are dielectrically insulated from the semiconductor body 100 by gate dielectrics $22_1$, $22_2$. The source region 12 and the channel region 14 are arranged between the two gate electrodes $21_1$, $21_2$, with each of these gate electrodes extending in a vertical direction of the semiconductor body 100. Optionally, semiconductor regions 32 of the second conductivity type are arranged below the first and second gate electrodes $21_1$, $21_2$ in the semiconductor body 100. In this component the first gate electrode $21_1$ corresponds to the gate electrode of the component illustrated with reference to FIGS. 1 to 11 and is connected to a first gate terminal G1 (schematically illustrated). The second gate electrode $21_2$ is connected to a second gate terminal G2. The transistor further includes at least one discharge region 31 which is arranged distant to the first region 12. In the embodiment illustrated in FIG. 12 the discharge region 31 is arranged adjacent the first surface 101 and is separated from the source region 12 by one of the first and second gate electrodes $21_1$, $21_2$. Optionally the discharge region 31 includes two sections $31_1$, $31_2$: A first section $31_1$ which is arranged adjacent the first gate electrode $21_1$, and a second section $31_2$ which is arranged adjacent the second gate electrode $21_2$. The discharge region 31 is connected to a terminal REF1 for a reference potential.

According to one embodiment the terminal REF1 for the reference potential is connected to one of the first and second gate terminals G1, G2. In an n-type transistor the discharge region 31 is, for example, connected to that terminal of the first and second gate terminals G1, G2 which has the lower electrical potential when the transistor is in operation. When such depletion transistor is employed in a circuit in which there are electrical potentials that are lower than the gate potentials G1, G2, the discharge region 31 could also be connected to a terminal for such lower potential. Like the depletion transistor illustrated with reference to FIGS. 1 to 11 the depletion transistor of FIG. 12 can be employed in a charging circuit with a capacitive storage element.

Figure 13:
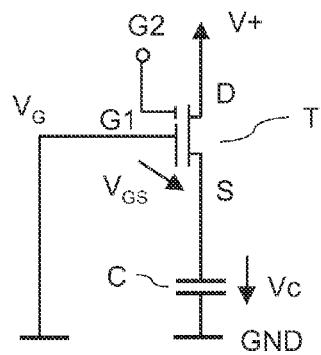
FIG. 13 illustrates a circuit diagram of a charging circuit with a depletion transistor and a capacitive charge storage element according to a further embodiment.

FIG. 13 illustrates the use of the transistor of FIG. 12 in the charging circuit illustrated with reference to FIG. 3. In this charging circuit the first gate terminal G1 is connected like the gate terminal G of the transistor in FIG. 3. In the embodiment of FIG. 13 the terminal REF1 for the reference potential is connected with the first gate terminal G1. However, this is only an example, this terminal for the reference potential REF1 could also be connected with the second gate terminal G2. In the transistor of FIG. 12 the second gate electrode $21_2$ serves to adjust the pinch-off voltage of the depletion transistor. The electrical potential applied to the second gate terminal G2 can be negative relative to the electric potential at the first gate terminal G1, or can be positive relative to the electrical potential at the first gate terminal G1.

Simulations with an embodiment of an n-type transistor have shown that the pinch-off voltage of the depletion transistor can be varied between −6V and −16V relative to the source potential when varying the electrical potential at the second gate terminal G2 between −10V and 10V relative to the source potential. These simulation results were obtained for a depletion transistor with a doping concentration of the channel region 14 of $1 \cdot 10^{14}$ cm$^{-3}$ and a with a channel width of 6 m.

The operating principle of a depletion transistor with a first gate electrode $21_1$ and with a second gate electrode $21_2$, with the second gate electrode $21_2$ having a fixed potential, will now be explained. The electrical potential applied to the second gate terminal G2 and the second gate electrode $21_2$ respectively influences the electric field in the channel region along the second gate electrode $21_2$. In an n-type transistor a negative potential of the second gate electrode $21_2$ causes a depletion region in the channel region 14 along the second gate electrode 21, wherein this depletion region with increasing negative electrical potential of the second gate electrode $21_2$ extends further into the direction of the first gate electrode $21_1$. A conducting channel is pinched-off, when the depletion region caused by the potential applied to the second gate electrode $21_2$ and a depletion region caused by the potential applied to the first gate electrode $21_1$ contact each other. Thus, the absolute value of the electrical potential which is to be applied to the first gate electrode $21_1$ in order to pinch-off the channel decreases when the absolute value of a negative electrical potential applied to the second gate electrode $21_2$ increases.

In an n-type depletion transistor a positive potential at the second gate electrode $21_2$ causes an accumulation channel along the second gate electrode $21_2$ in the channel region. Consequently, a more negative electrical potential is required at the first gate electrode $21_1$ in order to pinch off the channel. Thus, the absolute value of the electrical potential which is to be applied to the first gate electrode $21_1$ in order to pinch-off the channel increases when the absolute value of a positive electrical potential applied to the second gate electrode $21_2$ increases.

Instead of applying a fixed potential to the second gate electrode $21_2$ and applying a variable potential to the first gate electrode $21_1$, it is also possible to have varying potentials at both the first and the second gate electrodes $21_1$, $21_2$. In this case, the transistor can be pinched off by applying the pinch-off voltage at one of the first and second gate terminals G1, G2, wherein the pinch-off voltage is dependent on the potential applied to the other one of the first and second gate electrodes $21_1$, $21_2$.

Figure 14:
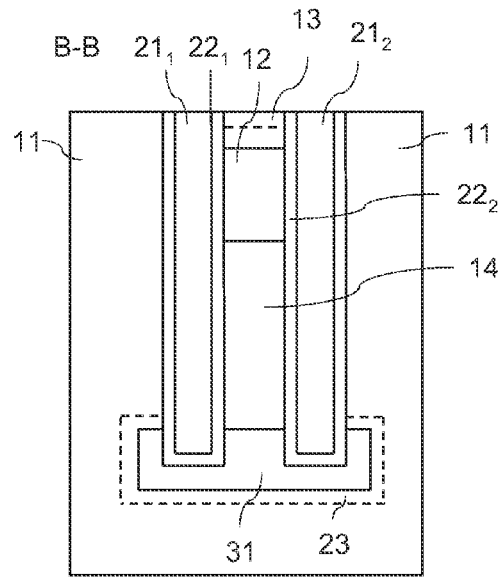
FIG. 14 illustrates a horizontal cross section through a depletion transistor with two gate electrodes according to a first embodiment.
Figure 15:
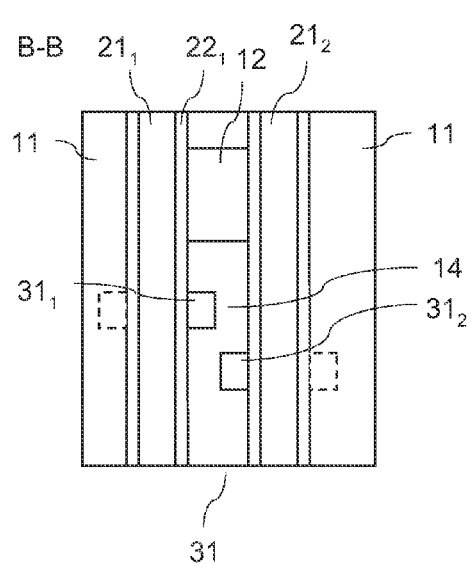
FIG. 15 illustrates a horizontal cross section through a depletion transistor with two gate electrodes according to a second embodiment.

Like in the depletion transistor with one gate electrode the discharge region 31 can be arranged in a plurality of different ways relative to the first and second gate electrodes. Different embodiments will be explained with reference to FIGS. 14 and 15. FIGS. 14 and 15 show horizontal cross sections through the embodiments of depletion transistor in a horizontal section plane B-B which cuts through the first and second gate electrodes $21_1$, $21_2$, the source region 12 and the discharge region 31. The general position of this horizontal section plane B-B is illustrated in FIG. 12. In each of the two embodiments illustrated in FIGS. 14 and 15 the first and second gate electrodes $21_1$, $21_2$ have a stripe-shaped geometry. The source region 12 is arranged between the first and second gate electrodes $21_1$, $21_2$ and adjoins the gate dielectric $22_1$, $22_2$ of the gate electrodes $21_1$, $21_2$. In the embodiment of FIG. 14 the discharge region 31 is arranged distant to the source region 12 in a longitudinal direction of the first and second gate electrodes $21_1$, $21_2$. In this embodiment the discharge region 31 is arranged at longitudinal ends of the first and second gate electrodes $21_1$, $21_2$ and reaches from one of these gate electrodes $21_1$, $21_2$ to the other one of these gate electrodes $21_1$, $21_2$.

By additionally providing two dielectric layers 23 (illustrated in dashed lines), which extend between the two gate electrode structures 21, 22, a dielectric structure can be formed which in the horizontal plane encloses the semiconductor region with the source region 14 and the discharge region 31.

The transistor according to FIG. 15 includes two discharge regions of the second conductivity type. A first discharge region $31_1$ which is arranged adjacent the first gate electrode $21_1$ of the first gate dielectric $22_1$, and a second discharge region $31_2$ which is arranged adjacent the second gate electrode $21_2$ of the second gate dielectric $22_2$. These discharge regions are arranged distant to the source region 12 in the longitudinal direction of the first and second gate electrodes $21_1$, $21_2$, and are arranged distant from each other. The two discharge regions $31_1$, $31_2$ are arranged between the first and second gate electrodes $21_1$, $21_2$ in the embodiment illustrated in FIG. 15. However, this is only an example. One of these discharge regions or both of these discharge regions could also be arranged outside the semiconductor region which is defined by the two first and second gate electrodes $21_1$, $21_2$. The position of the first and second discharge regions $31_1$, $31_2$ is illustrated in dashed lines in FIG. 15 for this case. In this case, the first and second discharge regions $31_1$, $31_2$ are separated from the source region 12 by the first and second gate electrodes $21_1$, $21_2$ and the first and second gate dielectric $21_1$, $22_2$. The first and second discharge regions $31_1$, $31_2$ have terminals (not shown) for connecting these terminals to reference potentials. According to a first embodiment the first discharge region is electrically connected with the first gate electrode $21_1$, and the second discharge region is electrically connected with the second gate electrode $21_2$.

Figure 16:
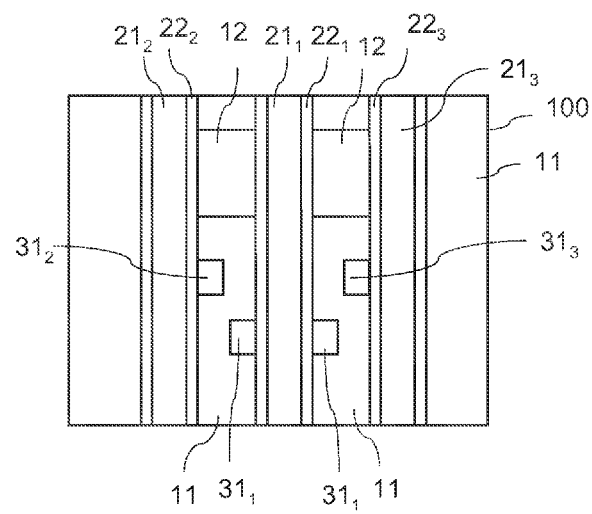
FIG. 16 illustrates a horizontal cross section through a depletion transistor with three gate electrodes according to a first embodiment.

FIG. 16 illustrates a horizontal cross section through a depletion transistor according to a further embodiment. Besides the first gate electrode $21_1$ this transistor has two additional gate electrodes $21_2$, $21_3$ which are dielectrically insulated from the semiconductor body 100 by a second and a third gate dielectric $22_2$, $22_3$. The three gate electrodes $21_1$, $21_2$, $21_3$ have a stripe-shaped geometry, wherein the first gate electrode $21_1$ is arranged between the second and third gate electrodes $21_2$, $21_3$. The source region 12 includes two source region sections: A first section arranged between the first and second gate electrodes $21_1$, $21_2$, and a second source section arranged between the first gate electrode $21_1$ and the third gate electrode $21_3$.

The component according to FIG. 16 includes three discharge regions which are each arranged distant to the source region 12: A first discharge region $31_1$ arranged adjacent the first gate electrode $21_1$ of the first gate dielectric $22_1$; a second discharge region $31_2$ arranged adjacent the second gate electrode $21_2$ of the second gate dielectric $22_2$; and a third discharge region $31_3$ arranged adjacent the third gate electrode $21_3$ of the third gate dielectric $22_3$. In the embodiment illustrated in FIG. 16 the first discharge region $31_1$ has two sections: A first section arranged between the first and second gate electrodes $21_1$, $21_2$, and a second section arranged between the first and the third gate electrodes $21_1$, $21_3$. The second discharge region $31_2$ is arranged between the first and second gate electrodes $21_1$, $21_2$ in the embodiment of FIG. 16, and the third discharge region $21_3$ is arranged between the first gate electrode $21_1$ and the third gate electrode $21_3$ in the embodiment of FIG. 16.

The depletion transistor according to FIG. 16 includes two depletion sub-transistors: A first sub-transistor which includes the first gate electrode $21_1$ the second gate electrode $21_2$ and a first channel region between these two gate electrodes $21_1$, $21_2$; and a second sub-transistor which includes the first gate electrode $21_1$ the third gate electrode $21_3$ and a second channel region between these two gate electrodes $21_1$, $21_3$. The first and second sub-transistors are controlled by the electrical potentials applied to the second and third gate electrodes $21_2$, $21_3$. According to one embodiment, the first gate electrode $21_1$ has a fixed potential which—similar to the electrical potential of the second gate electrodes of the transistors according to FIGS. 14 and 15—influences the electrical potentials required at the second and third gate electrodes $21_2$, $21_3$ in order to pinch the first and second channels off. The transistor with the two sub-transistors is pinched off, when each of the first and second channels is pinched off. For this, the pinch-off voltage is to be applied to each of the second and third gate electrodes $21_2$, $21_3$.

Figure 17:
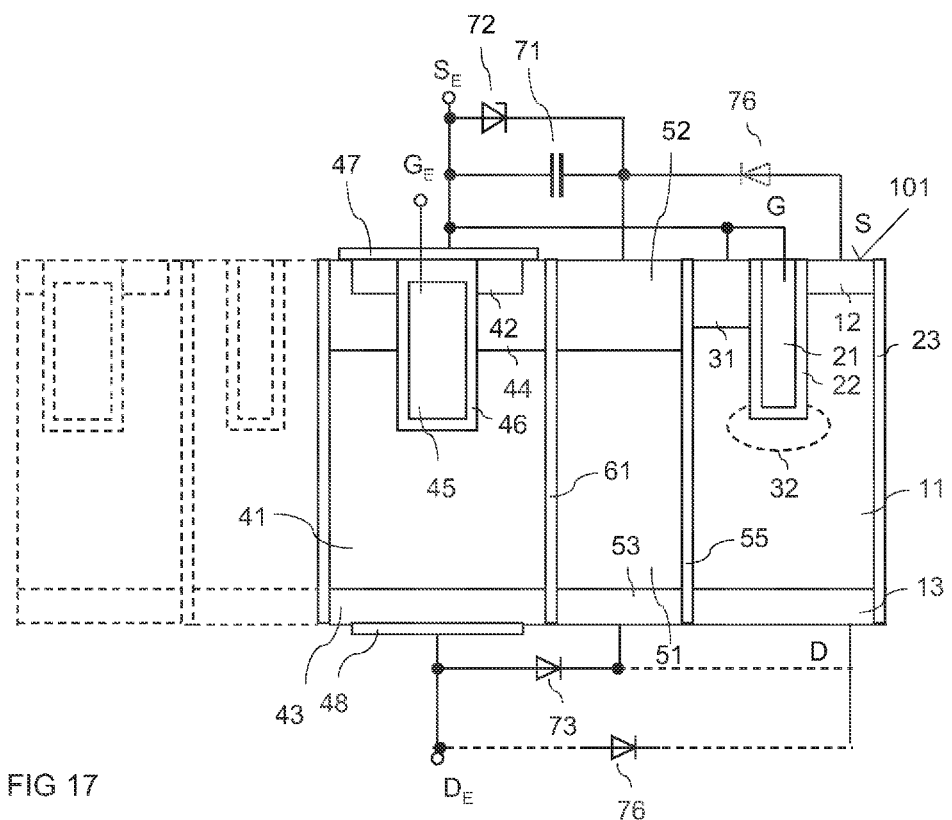
FIG. 17 schematically illustrates a vertical cross section through an integrated circuit according to a first embodiment with an enhancement transistor and a charging circuit with a depletion transistor.

FIG. 17 illustrates a vertical cross section through an integrated circuit in which a depletion transistor is employed. The depletion transistor illustrated in FIG. 17 corresponds to the depletion transistor illustrated in FIG. 2. However, this is only an example. Instead of the depletion transistor of FIG. 2 any other of the depletion transistors illustrated with reference to FIGS. 1 to 16 or any other depletion transistor with at least one discharge region that employs the basic principle illustrated hereinabove can be used as well. The integrated circuit further includes an enhancement MOSFET with a drift region 41, a source region 42, a drain region 43 and a body region 44. The body region 44 is arranged between the source region 42 and the drift region 41 and is doped complementarily to the drift region 41 and the source region 42. The source region 42 and the body region 44 are contacted by a source electrode 47 which forms a source terminal $S_E$ of the enhancement MOSFET. The drain region 43 adjoins the drift region 41 at an end opposite to the body region 44 and is contacted by a drain electrode 48 which forms a drain terminal $D_E$ of the enhancement MOSFET.

The enhancement MOSFET illustrated in FIG. 17 is a vertical MOSFET, i.e. a MOSFET in which the source and the drain region are arranged distant to one another in a vertical direction of a semiconductor body 100, or in which a current flows in vertical direction when the transistor is in its on-state. However, a lateral transistor may be used as well.

The enhancement MOSFET further includes a gate electrode 45 which is arranged adjacent the body region 44 and is dielectrically insulated from the body region 44 (and the drift and source regions 41, 42) by a gate dielectric 46. In the embodiment illustrated in FIG. 17 the gate electrode is a trench electrode, which is arranged in a trench that extends in a vertical direction of a semiconductor body 100 in which semiconductor regions of the integrated circuit are integrated. However, using a gate electrode 45 with a trench design is only an example. Any other gate electrode designs like a planar electrode, may be used as well.

In the embodiment illustrated in FIG. 17 the enhancement MOSFET and the depletion MOSFET are integrated in the same semiconductor body 100. However, these two transistors can be integrated in two different semiconductor bodies as well.

In FIG. 17 only one transistor cell of the enhancement MOSFET is illustrated. It goes without saying that the enhancement MOSFET may include a plurality of transistor cells (illustrated in dashed lines in FIG. 17) which are connected in parallel by connecting their source electrodes with each other, connecting their drain electrodes with each other and connecting their gate electrode with each other.

The enhancement MOSFET can be implemented as an n-type MOSFET. In this case the drift region 41, the source region 42, and the drain region 43 are n-doped, while the body region 44 is p-doped. The enhancement MOSFET could also be implemented as a p-typed MOSFET, wherein in this case the drift region 41, the source region 42 and the drain region 43 are p-doped, while the body region 44 is n-doped.

The enhancement MOSFET further includes a drift control region 51 which is arranged adjacent the drift region 41 and which is dielectrically insulated from the drift region 41 by a drift control region dielectric 61. The doping type of the drift control region 51 corresponds, for example, to the doping type of the drift region 41. However, these regions may also be doped complementarily. The drift control region 51 includes two terminal zones: A first terminal zone 52 which is doped complementarily to the drift region 51, and a second terminal zone 53 which is of the same doping type as the drift region 51 and which is more highly doped. The drift region 51 via the second terminal zone 53 and a rectifier element 73, like a diode, is connected to the drain terminal $D_E$. The rectifier element 73 is biased such that in an n-type enhancement MOSFET the drift control region 51 can assume an electrical potential which is higher than the electrical potential at the drain terminal $D_E$, i.e. such that the drift control region cannot be discharged to the electric potential of the drain region 43. Via the first terminal zone 52 the drift control region 51 is connected to the source terminal S of the depletion transistor. A capacitive charge storage element 71, like a capacitor, is connected between the source terminal $S_E$ of the enhancement MOSFET and the first terminal zone 52 of the drift control region 51 or the source terminal S of the depletion transistor, respectively. Optionally, a voltage limiting circuit 72 is connected parallel to the capacitive charge storage element 71. The voltage limiting circuit 72 acts as a protection element which limits the voltage across the charge storage element 71 to a given breakthrough-voltage at which the voltage limiting circuit 72 allows a current to bypass the charge storage element. The voltage limiting circuit 72 can be implemented as a Zener diode or can be implemented as series circuit with two or more Zener diodes, when higher breakthrough voltages are desired.

The integrated circuit according to FIG. 17 has three external terminals: The gate terminal $G_E$ of the enhancement MOSFET, the source terminal $S_E$ of the enhancement MOSFET, and the drain terminal $D_E$ of the enhancement MOSFET. The integrated circuit—from an external point of view—works like a conventional enhancement MOSFET that can be switched on and off by applying suitable drive voltages between the gate terminal $G_E$ and the source terminal $S_E$. When the MOSFET is an n-type MOSFET it is switched on when there is a positive voltage between the drain terminal $D_E$ and the source terminal $S_E$, and when there is a positive drive voltage between the gate terminal $G_E$ and the source terminal $S_E$. An n-type MOSFET is switched off, when the drive voltage is below a threshold voltage. In the integrated circuit according to FIG. 17 the drift control region 51 is adapted to generate a conducting channel in the drift region 41 along the drift control region dielectric 61 when the MOSFET is in its on-state. The conducting channel is, for example, an accumulation channel. The operating principle of the integrated circuit will be explained in the following. For explanation purposes it is assumed that both, the enhancement MOSFET and the depletion MOSFET are n-type MOSFETs. However, the operating principle illustrated in the following is also valid for p-type MOSFETs.

When the integrated circuit illustrated in FIG. 17 is in operation, a positive voltage is applied between the drain terminal $D_E$ and the source terminal $S_E$. The voltage that can be applied without destroying the enhancement MOSFET is dependent on the voltage blocking capability of the MOSFET, wherein the voltage blocking capability dependent on the specific design of the MOSFET can be up to several 100V, and more. When a positive voltage is applied between the drain terminal $D_E$ and the source terminal $S_E$ the voltage is also applied between the series circuit with the depletion transistor and the charge storage element 71, wherein this series circuit is connected between the drain terminal $D_E$ and the source terminal $S_E$. In the embodiment illustrated in FIG. 17 the drain terminal D of the depletion transistor is connected with the drain terminal $D_E$ of the enhancement transistor via the rectifier element 73.

Alternatively, the drain terminal D of the depletion transistor is not connected to the drain terminal $D_E$ of the enhancement transistor via the rectifier element 73, but via a further rectifier element 76 (illustrated in dashed lines, which can be implemented as a diode.

According to a further alternative, the drain terminal D of the depletion transistor is directly connected to the drain terminal $D_E$ of the enhancement transistor and the further rectifier element 76 (illustrated in dotted lines) is connected between the source terminal of the depletion transistor and the capacitive charge storage element 71.

Referring to the explanations provided in connection with FIGS. 3 and 13 charging of the capacitive charge storage element 71 stops when the depletion transistor pinches-off, wherein in the embodiment illustrated in FIG. 17 in which the gate terminal of the depletion transistor is connected with the source terminal $S_E$ of the enhancement MOSFET, the voltage to which the capacitive charge storage element 71 is loaded, corresponds to the pinch-off voltage of the depletion transistor. This pinch-off voltage can be adjusted via a separate terminal, namely a second gate terminal, when instead of the depletion transistor according to FIG. 17 a depletion transistor with two gate electrodes, like one of the transistors illustrated in FIG. 12, 14 or 15, is used.

When the enhancement MOSFET is switched on by applying a suitable drive voltage between the gate terminal $G_E$ and the source terminal $S_E$ a voltage drop between the drain terminal $D_E$ and the source terminal $S_E$ decreases. This causes the drift control region 51 to be charged to a higher potential relative to the drift region 41, wherein charge carriers necessary for charging the drift control region 51 are provided from the charge storage element 71. The higher potential in the drift control region 51 relative to the drift region 41 results in an accumulation channel in the drift region 41 along the drift control region dielectric 61, wherein this accumulation channel significantly reduces the on-resistance of the enhancement MOSFET compared with a conventional enhancement MOSFET. In this operation state diode 73 prevents that the drift control region 51 is discharged to the drain terminal $D_E$.

The difference in the electrical potentials between the drift region 41 and the drift control region 51 is mainly determined by the voltage across the charge storage element 71, wherein this voltage is mainly determined by the pinch-off voltage of the depletion transistor. When the enhancement MOSFET is switched off and the voltage drop between the drain terminal $D_E$ and the source terminal $S_E$ increases the charge carriers from the drift control region 51 flow back into the capacitive charge storage element 71, wherein those charge carriers that have been "lost" during the switching process are replaced via the depletion transistor.

In the integrated circuit of FIG. 17 the charge storage element is charged as soon as a supply voltage is applied between the source and drain terminals $S_E$, $D_E$ so that at the time of switching the enhancement MOSFET on for the first time the electric charge which is required in the drift control region 51 in order to generate a conducting channel in the drift region is already available, namely in the charge storage element 71.

Figure 18:
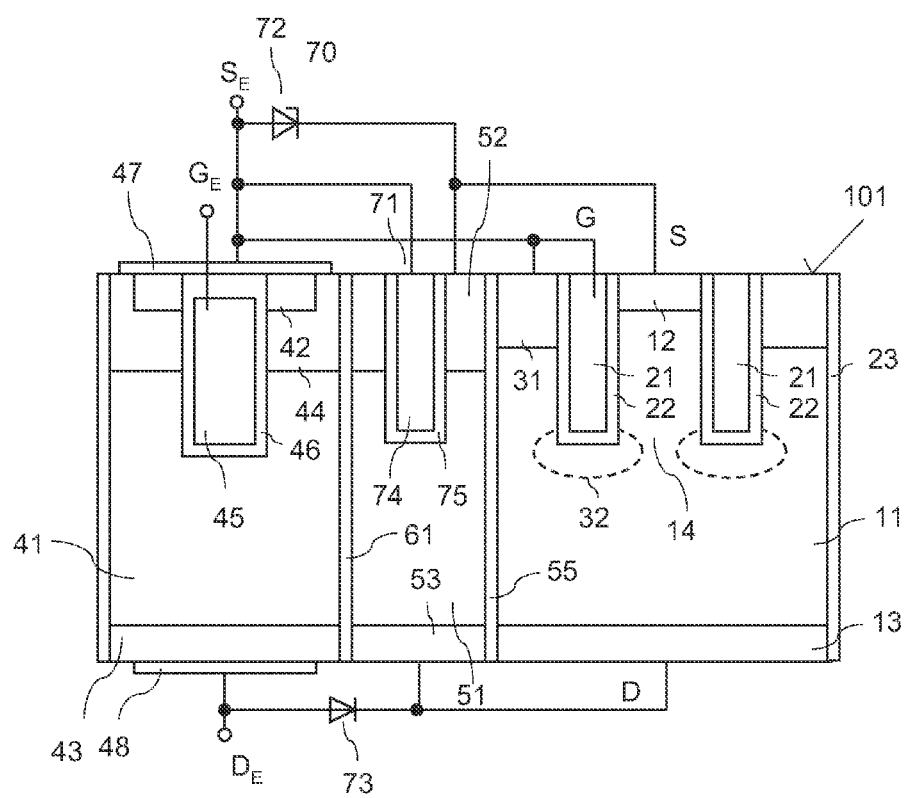
FIG. 18 schematically illustrates a vertical cross section through an integrated circuit according to a second embodiment with an enhancement transistor and a charging circuit with a depletion transistor.

The charge storage element 71 can be implemented in many different ways. The charge storage element 71 can be an external component, or can be integrated in the semiconductor body. FIG. 18 illustrates an embodiment of an integrated circuit in which the capacitive charge storage element is integrated in the drift control region and its first terminal zone. The charge storage element 71 includes a first electrode 74 which is separated from the drift control region 51 and the first terminal zone by a capacitor dielectric 75. The first electrode 74 is arranged in a trench and includes a conducting material like, for example, a metal or a highly doped polycrystalline semiconductor material. The first electrode 74 is connected to the source terminal $S_E$ of the enhancement MOSFET. The second electrode of the charge storage element is formed by the first terminal zone 52 of the drift control region and is connected to the source terminal S of the depletion transistor.

The depletion transistor in the circuit of FIG. 18 is implemented like the depletion transistor in FIG. 1 which includes two gate electrode sections.

In the integrated circuits illustrated in FIGS. 17 and 18 the charge storage element with the terminals facing away from the depletion transistor is connected to the source terminal of the enhancement transistor. However, this is only an example. The charge storage element could also be connected to a terminal for a reference potential other than the source potential instead of the source terminal.

In the integrated circuits illustrated in FIGS. 17 and 18 a depletion transistor according to FIG. 1 or FIG. 5 is shown. However, this is only an example. The depletion transistor could also be implemented with a structure as shown in FIGS. 2, 6 to 12, 14 to 16 or a combination of those.

In the embodiments that have been explained hereinbefore, the source and drain regions 12, 13 of the depletion transistor are arranged at opposite surfaces, namely the first and second surfaces 101, 102, of the semiconductor body. However, the basic principle explained hereinbefore is not restricted to be used in connection with this specific type of transistor. According to a further embodiment illustrated in FIG. 19, the source and drain regions 12, 13 could also be arranged at the same surface, like the first surface 101 of the semiconductor body. In this embodiment, the drain region 13 includes a contact region $13_1$ at the first surface 101, a buried region $13_2$ below the source region 12 and the gate electrode 21, and a connection region $13_3$ arranged between the contact region $13_1$ and the buried region $13_2$. Each of these three regions $13_1$, $13_2$, $13_3$ that form the drain region are of the first conductivity type. The doping concentrations of these three regions can be identical or can be different from one another.

The contact region $13_1$ is arranged distant to the source region 12, the gate electrode 21 and the discharge region 31 in a horizontal direction, wherein a semiconductor region between these regions and the contact region may have the same doping type and the same doping concentration as the drift region 11. The buried region $13_2$ is arranged distant to the source region 12, the gate electrode 21 and the discharge region 31 in a vertical direction, wherein the drift region 11 is arranged between these regions and the buried region $13_2$.

The buried region $13_2$ is arranged on a semiconductor layer 110 which can be implemented as substrate and which can have a doping type that is complementary to the doping type of the buried layer $13_2$.

Figure 19:
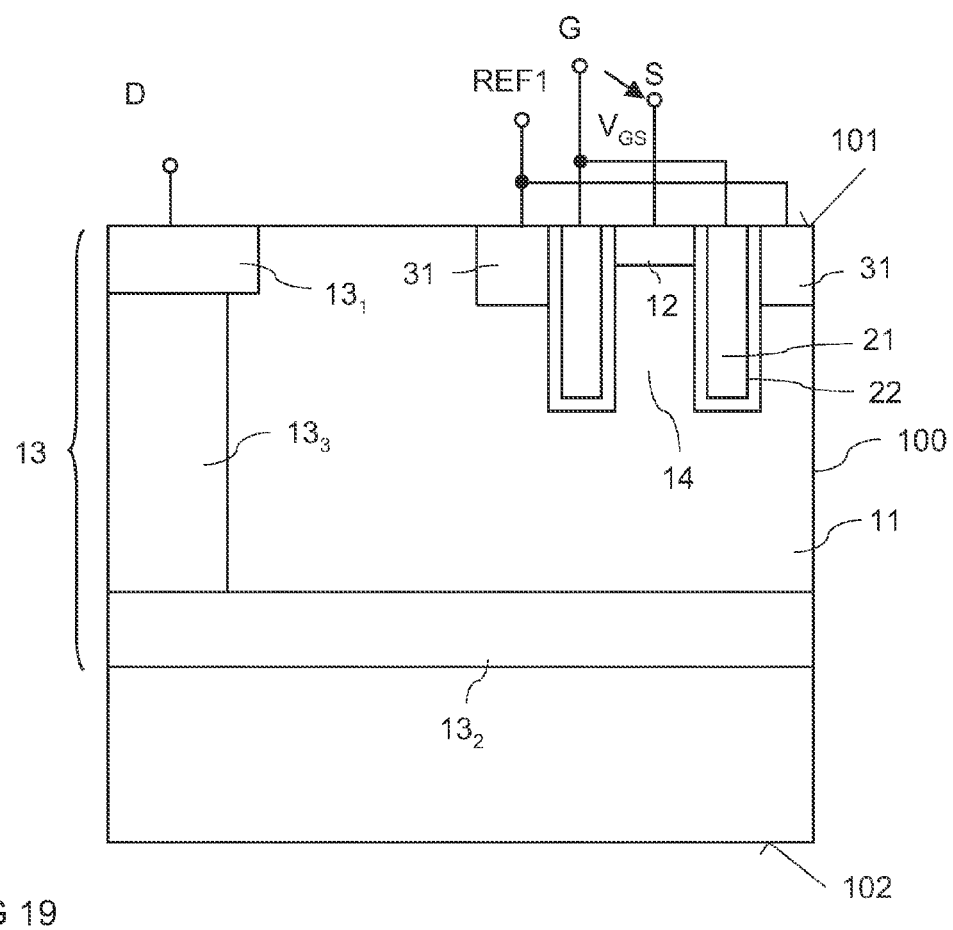
FIG. 19 schematically illustrates a vertical cross section through a depletion transistor according to a further embodiment.

In the embodiment illustrated in FIG. 19, the structure with the gate electrode 21, the gate dielectric, the channel region 14 and the discharge region 31 corresponds to that of FIG. 1. However, the structure with the source region, the gate electrode and the discharge region of any other embodiment explained hereinbefore, could be used as well.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof. Further, it should be noted that features which have been explained in connection with one embodiment can be combined with features of other embodiments, even when this has not explicitly been stated hereinbefore.

What is claimed is:

1. A depletion transistor comprising:
   a source region and a drain region of a first conductivity type;
   a channel region of the first conductivity type arranged between the source region and the drain region;
   a first gate electrode arranged adjacent the channel region and dielectrically insulated from the channel region by a gate dielectric; and
   a first discharge region of a second conductivity type arranged adjacent the gate dielectric and electrically coupled to a terminal for a reference potential.

2. The depletion transistor of claim 1, wherein the discharge region is arranged distant to the source region.

3. The depletion transistor of claim 1, wherein the terminal for the reference potential is the gate electrode.

4. The depletion transistor of claim 1, further comprising:
   a semiconductor body with a first and a second surface in which the source region, the drain region, the channel region and the discharge region are arranged,
   wherein the first gate electrode is arranged in at least one trench extending from the first surface in a vertical direction of the semiconductor body.

5. The depletion transistor of claim 4, wherein the first gate electrode is arranged between the source region and the discharge region.

6. The depletion transistor of claim 4, wherein the first gate electrode has a substantially ring-shaped geometry.

7. The depletion transistor of claim 6, wherein the first gate electrode is arranged between the source region and the discharge region.

8. The depletion transistor of claim 6, wherein the first gate electrode and the discharge region are arranged within an opening defined by the ring-shaped geometry.

9. The depletion transistor of claim 6, wherein the ring defined by the ring-shaped geometry has an opening.

10. The depletion transistor of claim 4, wherein the first gate electrode has a substantially spiral-shaped geometry.

11. The depletion transistor of claim 10, wherein the first gate electrode is arranged between the source region and the discharge region.

12. The depletion transistor of claim 4, wherein the first gate electrode comprises a first gate electrode section arranged in a first trench and a second gate electrode section arranged in a second trench which is distant to the first trench, and wherein the source region is arranged between the first and second trenches.

13. The depletion transistor of claim 12, wherein the first discharge region is arranged between the first and second trenches.

14. The depletion transistor of claim 5, further comprising:
a semiconductor region of the second conductivity type arranged below the at least one trench and distant to the source region.

15. The depletion transistor of claim 14, wherein the semiconductor region of the second conductivity type adjoins the discharge region.

16. The depletion transistor of claim 1, further comprising:
a second gate electrode arranged adjacent the channel region and dielectrically insulated from the channel region by a second gate dielectric.

17. The depletion transistor of claim 16, wherein the source region is arranged between the first and second gate electrodes.

18. The depletion transistor of claim 16, further comprising:
a second discharge region arranged adjacent the second gate electrode.

19. The depletion transistor of claim 18, wherein the first discharge region is electrically connected with the first gate electrode and wherein the second discharge region is electrically connected with the second gate electrode.

20. The depletion transistor of claim 19, further comprising:
a third gate electrode arranged between the first and second gate electrodes, and a third discharge region electrically connected with the third discharge region.

21. An integrated circuit comprising:
an enhancement transistor with a drift region and a drift control region arranged adjacent the drift region and electrically insulated from the drift region by a drift control zone dielectric;
a capacitive charge storage element coupled to the drift control region; and
a charging circuit coupled to the charge storage element, the charging circuit comprising:
a depletion transistor including:
a source region and a drain region of a first conductivity type;
a channel region of the first conductivity type arranged between the source region and the drain region;
a first gate electrode arranged adjacent the channel region and dielectrically insulated from the channel region by a gate dielectric; and
a first discharge region of a second conductivity type arranged adjacent the gate dielectric and electrically coupled to a terminal for a reference potential.

22. The integrated circuit of claim 21, wherein the charging circuit and the drift control region are connected to one common terminal of the charge storage element.

23. The integrated circuit of claim 21, wherein the enhancement transistor further includes a source terminal, and wherein the charge storage element is connected between the drift control region and the source terminal of the enhancement transistor.

24. The integrated circuit of claim 21, wherein the enhancement transistor and the depletion transistor are integrated in a common semiconductor body.

* * * * *